United States Patent [19]

Malik

[11] Patent Number: 5,078,801
[45] Date of Patent: Jan. 7, 1992

[54] POST-POLISH CLEANING OF OXIDIZED SUBSTRATES BY REVERSE COLLOIDATION

[75] Inventor: Farid A. Malik, Beaverton, Oreg.

[73] Assignee: Intel Corporation, Santa Clara, Calif.

[21] Appl. No.: 567,318

[22] Filed: Aug. 14, 1990

[51] Int. Cl.$^5$ ............................................. B08B 6/00
[52] U.S. Cl. ...................................... 134/29; 15/97.1;
51/131.1; 51/131.3; 51/131.4; 134/7;
148/DIG. 17; 437/974; 437/946; 437/225
[58] Field of Search ................. 134/7, 29; 51/131.1,
51/131.3, 131.4; 15/97.1; 148/DIG. 17;
437/974, 946, 225

[56] References Cited

U.S. PATENT DOCUMENTS

| | | | |
|---|---|---|---|
| 3,683,562 | 8/1972 | Day | 51/131.4 |
| 3,841,031 | 10/1974 | Walsh | 51/131.4 |
| 3,857,123 | 12/1974 | Walsh | 51/131.4 |
| 3,998,653 | 12/1976 | Anthony et al. | 51/131.4 |
| 4,879,258 | 11/1989 | Fisher | 437/225 |
| 4,968,381 | 11/1990 | Prigge et al. | 156/636 |

FOREIGN PATENT DOCUMENTS

| | | | |
|---|---|---|---|
| 56-35182 | 9/1982 | Japan | 51/131.4 |
| 60-20853 | 2/1985 | Japan | 51/131.4 |
| 62-54666 | 3/1987 | Japan | 51/131.4 |
| 61-99352 | 9/1987 | Japan | 51/131.4 |
| 62-41279 | 5/1988 | Japan | 51/131.4 |
| 1297487 | 5/1988 | Japan | 51/131.4 |

*Primary Examiner*—Asok Pal
*Attorney, Agent, or Firm*—Blakely, Sokoloff, Taylor & Zafman

[57] ABSTRACT

A method for cleaning the surface of an oxidized semiconductor wafer subjected to a planarization polishing process is described. The planarization process employes a slurry which contains abrasive particles suspended in a liquid solution. The invented cleaning method removes remnant particles electrochemically by placing the polished wafers in a PH-controlled bath.

10 Claims, 1 Drawing Sheet

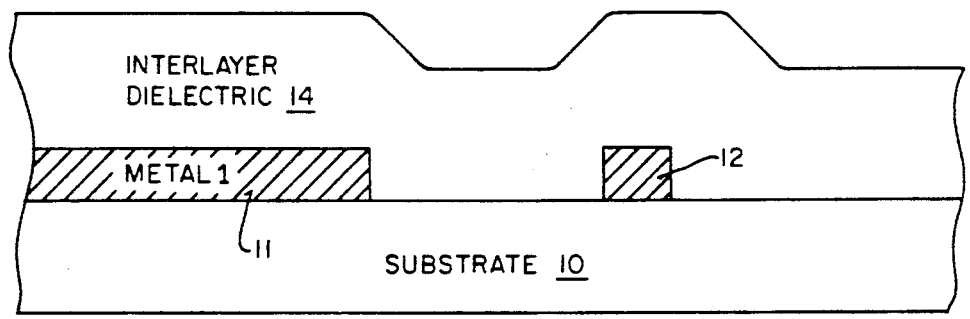
FIG _ 1
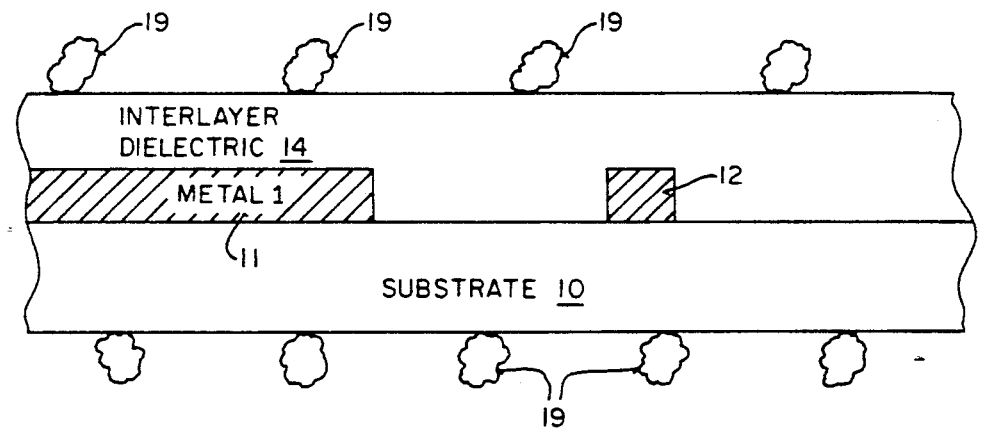
FIG _ 2
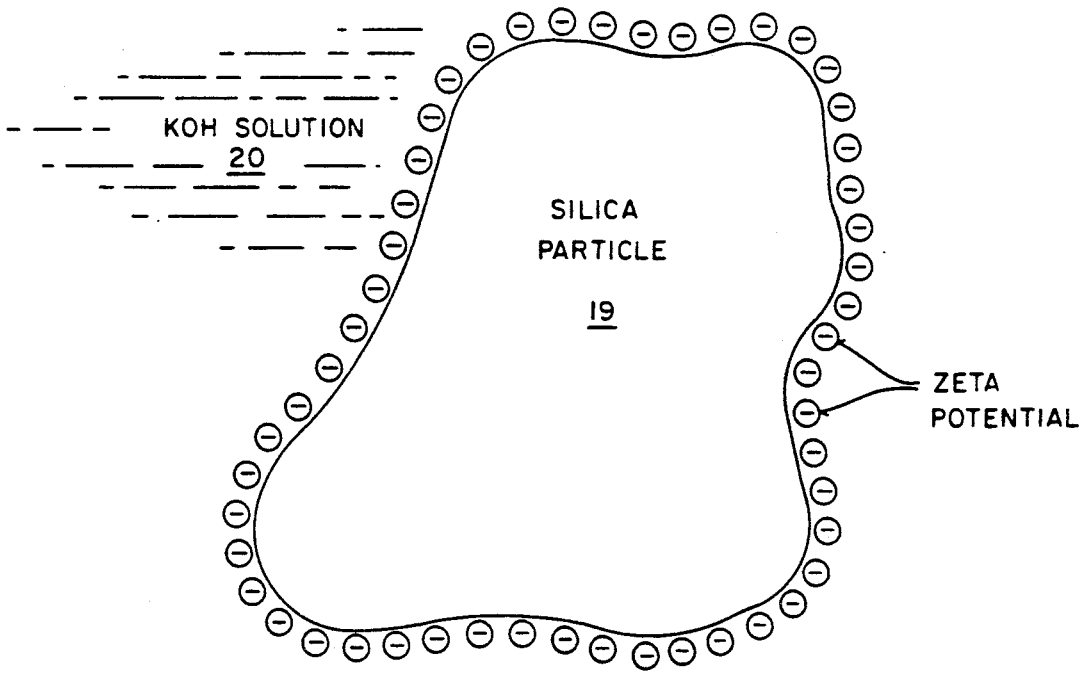
FIG _ 3

POST-POLISH CLEANING OF OXIDIZED SUBSTRATES BY REVERSE COLLOIDATION

FIELD OF THE INVENTION

The invention relates generally to the field of semiconductor processing; in particular, to methods of cleaning oxidized silicon substrates following planarization polishing.

BACKGROUND OF THE INVENTION

In the fabrication of integrated circuits an elaborate system of metallized interconnects are utilized to couple together each of the various devices. To achieve these interconnections it is common to employ multiple layers of metal.

Conventionally, the process of forming multiple layers of metal begins by forming an insulative layer over the substrate. This layer (usually silicon dioxide) insulates the substrate from the first metalization layer (metal 1). Openings are etched in the insulative layer to contact the devices. Next, a metal layer—typically aluminum or an aluminum alloy—is deposited over the entire surface of the substrate. This metal 1 layer is then etched to pattern the interconnects. Afterwards, an interlayer dielectric is deposited to insulate metal 1 from the next metallization layer (i.e., metal 2). In many integrated circuits the interlayer dielectric comprises a chemical vapor deposition (CVD) of silicon dioxide. The silicon dioxide layer covers the metal 1 layer such that the upper surface of the silicon dioxide layer is characterized by a series of non-planer steps.

These step variations in the upper surface of the interlayer dielectric have several undesirable features. First, a non-planer dielectric surface interferes with the optical resolution of subsequent photolithographic processing steps. This makes it extremely difficult to print high resolution lines. A second problem involves the step coverage of the metal 2 layer over the interlayer dielectric. If the step height is too large there is a serious danger that open circuits will be formed in the metal 2 layer. Therefore, to decrease these undesirable effects, it is necessary to planarize or polish the upper surface of the deposited dielectric.

The common method employed in polishing an oxidized layer is to place the silicon substrate facedown on a table coated with an abrasive solution. Both the wafer and the table are then rotated relative to each other in an abrasive fashion to remove the protruding steps. After polishing, the substrate is usually dipped in de-ionized water in an attempt to rinse off the abrasive solution. The problem, however, is that this dip is only partially effective in removing the silica particles. A large percentage of silica particles remain imbedded in, or adhere to, the surface of the wafer.

The cause of this phenomena is not entirely understood. It is believed that the particles adhere to the substrate for two reasons. First, the particles may be physically ground into the dielectric layer as a consequence of the abrasive polishing process. Thus, the silica particles may become imbedded in grooves, cracks or other incongruities in the surface of the oxide layer.

It is believed that the second cause for the attraction may be electrostatic in nature. That is, the negative zeta potential (to be described in more detail shortly) surrounding the silica particles attracts them to positive ions present in either the oxide or bulk of the silicon substrate. In any event, removal of these particles following polishing has proven problematic. Obviously, if the residual silica particles remain on the dielectric surface they may produce cracks, opens, shorts or other imperfections in the subsequently deposited metal 2 layer. More generally, it can be stated that the silica particles contaminate each of the subsequent processing steps leading to reduced functionality and lower yield in the finished integrated circuit (IC). What is needed then, is an improved cleaning process which is effective in completely removing all of the abrasive particles from the surface of a polished silicon substrate.

SUMMARY OF THE INVENTION

An method for removing residual slurry particles from a polished dielectric layer is disclosed. After polishing, the substrate is dipped in a solution having a PH value that is adjusted to cause particles having a certain zeta potential to be repelled from the substrate surface. In one embodiment, a KOH-based solution is employed having a PH of approximately 10. This is consistant with the use of a KOH-based polishing slurry containing abrasive silica particles. Optionally, the PH-controlled dip may be followed by a dump rinse in de-ionized water, an ultrasonic cleaning step, and finally a spin rinse dry of the wafer.

BRIEF DESCRIPTION OF THE DRAWINGS

The present invention is illustrated by way of example and not limitation in the figures of the accompanying drawings, in which like references indicate similar elements, and wherein:

FIG. 1 is a cross-sectional view of a substrate following deposition of an interlayer dielectric.

FIG. 2 is a cross-sectional view of the substrate following planarization. Residual slurry particles are shown surrounding the dielectric and substrate surfaces.

FIG. 3 illustrates a slurry particle suspended in a colloidal solution of KOH. The particle's zeta potential is also shown.

DESCRIPTION OF THE PREFERRED EMBODIMENT(S)

A process for removing residual silica particles from a post-polished silicon substrate is disclosed. In the following description, numerous specific details are set forth, such as specific materials, chemicals, PH values, etc., in order to provide a thorough understanding of the invention. It will be obvious, however, to one skilled in the art that these specific details need not be used to practice the present invention. In other instances, other well-known structures and processing steps have not been described in detail in order to avoid unnecessarily obscuring the present invention.

Referring to FIG. 1, a cross-sectional view of a substrate 10 is shown immediately following deposition of interlayer dielectric 14 and just prior to planarization. Interlayer dielectric 14 normally comprises a CVD layer of silicon dioxide grown to a thickness of several thousand angstroms. Also shown is substrate 10 having assorted metal interconnects, e.g. 11 and 12, patterned across its surface. These metal interconnects provide electrical coupling between the individual devices of the integrated circuit. FIG. 1 also illustrates the step variations produced when silicon dioxide layer 14 is conformally deposited over metal lines 11 and 12.

Following the deposition of dielectric 14, substrate 10 is abrasively polished to substantially flatten the upper surface of the oxide layer. Essentially, planarization is accomplished by positioning a wafer face down on a table which has been coated with an abrasive material. Most often, the abrasive material comprises a colloidal suspension of silica particles in a KOH-based solution. Rotational movement of the wafer relative to the table, together with applied pressure to the backside of the substrate (forcing the dielectric into contact with the pad surface), acts to abrasively polish the dielectric layer.

According to a common prior art method, at this point in the process the wafer is then dipped in de-ionized water in an attempt to clean the residual silica particles from the surface of the substrate. FIG. 2 illustrates substrate 10 after planarization and a dip in de-ionized water. Clearly, this technique is ineffective in removing all, or substantially all, of the silica particles from the oxide and substrate surfaces.

In contrast, according to the present invention after the wafer has been polished, it is then placed in a base-like (e.g., PH > 7) solution which electrostatically repels the silica particles from the surface of both the oxide and the substrate. In other words, it is found that dipping a post-polished wafer in a bath solution having a PH value which is greater than 7 causes the particles to be repelled off of the silicon wafer. In effect, the slurry particles "jump off" of the wafer into the base solution. In the currently preferred embodiment, a clear (silica free) KOH-based solution having a PH approximately equal to 10 is utilized. The inventor refers to this phenomena as cleaning by reverse colloidation.

In order to understand why the invented process of reverse colloidation is effective in removing residual particles, one must first recognize that all particulate matter develops an electrically charged thin layer when suspended in a liquid solution. This charge is known as the zeta potential and can be either negative or positive in value. In actuality, the zeta potential appears at the outer surface of the particle—surrounding the particle in a small charge field. This is depicted in FIG. 3, wherein silica particle 19 is shown suspended in KOH-based solution 20. In the case of a KOH-based slurry, the silica particles assume a negative zeta potential.

Astonishingly, it has been found that a base solution (i.e., PH > 7) is effective in electrochemically repelling the negatively charged particles from the silicon or silicon dioxide surfaces. It is appreciated that the strength and polarity of the zeta potential may vary depending on the type of slurry employed. Therefore, the relative acidity or baseness of the post-polish dip solution may be adjusted depending on the characteristics of the particular slurry employed. This means that a higher or lower PH value may be needed depending on the type of slurry used and the characteristic zeta potential which develops. Presumably, if the particle were to assume a positive zeta potential then an acidic solution (i.e., PH < 7) would be needed to completely clean the wafer free from any residual slurry particles. Thus, the effectiveness of the cleaning or particle removing process is optimized by adjusting the PH value of the post-polish dip solution for the particular slurry employed.

Note that in any event—either using a base or acidic cleaning solution—care must be taken to avoid selecting a solution having a PH which attacks the intermetal insulative layer, or any other fabricated circuit structure. As previously mentioned, for a Cabot SC-1 or SC-3010 slurries, a KOH-based solution having a PH of approximately 10 is preferably utilized in the post-polish cleaning process of the present invention. The temperature of the cleaning solution is relatively unimportant to the removal process; therefore a room temperature KOH solution is ordinarily used. The dip time is on the order of five minutes.

The following is a detailed list of the steps performed after planarization in accordance with the currently preferred process flow. The additional steps after the KOH dip help to clean the wafer of any chemical residue or loose contaminates prior to subsequent processing.

1) KOH dip for 5 minutes; 25 degrees C.; PH ~ 10
2) Quartz dump rinse using de-ionized water; 25 degrees C.
3) Megasonic clean in de-ionized water; 40 degrees C.
4) Spin rinse dry Although the present invention has been described in conjunction with the cleaning of an intermetal dielectric layer (i.e., between metal 1 and metal 2), it is appreciated that the present invention is not limited to just this use. For instance, the invented process can also be used to clean other types of post-polished dielectric layers, such as a field oxide or a polysilicon gate dielectric layer utilized in a process for forming field-effect transistors. In another alternative embodiment a solution—other than KOH—may be employed as the PH controlled cleaning solution. Therefore, it is to be understood that the particularly embodiments shown and described by way of illustration are in no way intended to be considered limiting. Reference to the details of the preferred embodiment is not intended to limit the scope of the claims which themselves recite only those features regarded as essential to the invention.

I claim:

1. In a process for polishing an oxide film formed over a silicon substrate utilizing a colloidal suspension of particles, a post-polishing method for cleaning said substrate to remove residual particles adhering to the surface of said substrate, said method comprising the steps of:
   placing said substrate in a solution having a sufficiently high alkalinity to electrochemically repel said residual particles from said substrate;
   removing said substrate from said solution.

2. The method as described in claim 1 wherein said particles comprise silica particles.

3. The method as described in claim 2 wherein the PH of said solution is approximately 10.

4. The method as described in claim 3 wherein said solution is a KOH-based solution.

5. The method as described in claim 4 further comprising the steps of:
   rinsing said substrate in de-ionized water;
   ultrasonically cleaning said substrate in de-ionized water; and
   drying said substrate.

6. In a semiconductor polishing process utilizing an apparatus which forcibly presses a semiconductor substrate against a pad coated with a slurry containing abrasive particles suspended in a liquid, said particles having a characteristic zeta potential of a certain plarity, and said pad and said substrate being set in relative movements to one another to facilitate planarization of a dielectric layer formed on said substrate, a post-polishing method for cleaning said substrate to remove remnant slurry particles adhering to the surface of said substrate comprising the steps of:

placing said substrate in a PH-controlled solution to electrochemically repel said residual particles from said substrate, the PH level of said solution being adjusted to said certain polarity such that if said zeta potential is negative said PH level is greater than 7, and if said zeta potential is positive said PH level is less than 7;

removing said substrate from said solution.

7. The method as described in claim 6 wherein said particles comprise silica particles.

8. The method as described in claim 7 wherein said PH level is approximately 10.

9. The method as described in claim 8 wherein said solution is a KOH-based solution.

10. The method as described in claim 9 further comprising the steps of:

rinsing said substrate in de-ionized water;

ultrasonically cleaning said substrate in de-ionized water; and drying said substrate.

* * * * *